(12) United States Patent
Traeber

(10) Patent No.: US 7,336,735 B2
(45) Date of Patent: Feb. 26, 2008

(54) VITERBI DECODER

(75) Inventor: Mario Traeber, Munich (DE)

(73) Assignee: Infineon Technologies AG, Munich (DE)

( * ) Notice: Subject to any disclaimer, the term of this patent is extended or adjusted under 35 U.S.C. 154(b) by 647 days.

(21) Appl. No.: 10/615,100

(22) Filed: Jul. 8, 2003

(65) Prior Publication Data

US 2004/0052318 A1   Mar. 18, 2004

Related U.S. Application Data

(63) Continuation of application No. PCT/EP02/00595, filed on Jan. 22, 2002.

(30) Foreign Application Priority Data

Jan. 23, 2001 (DE) .............................. 101 02 928

(51) Int. Cl.
*H03D 1/00* (2006.01)
(52) U.S. Cl. ................. 375/341; 375/233; 375/262; 375/265; 375/340; 375/350; 704/242; 714/707; 714/788; 714/792; 714/795; 714/796
(58) Field of Classification Search ............. 375/233, 375/340, 341, 350, 265; 714/707, 788, 795, 714/792, 796
See application file for complete search history.

(56) References Cited

U.S. PATENT DOCUMENTS 4,879,729 A * 11/1989 Salembier et al. .......... 375/350

5,341,387 A * 8/1994 Nguyen ...................... 714/788
5,371,471 A * 12/1994 Chennakeshu et al. ..... 329/304
5,991,341 A * 11/1999 Shin .......................... 375/265
6,209,109 B1   3/2001 Hori et al.

FOREIGN PATENT DOCUMENTS

DE         197 42 958 A1    4/1999

(Continued)

OTHER PUBLICATIONS

Shafiee, H. et al., "A Reduced-Complexity Trellis Search Decoding Algorithm for Extended Class IV Partial Response Systems," *IEEE International Conference on Communications*, vol. 4, pp. 120-124 (Jun. 14, 1992).

(Continued)

*Primary Examiner*—David C. Payne
*Assistant Examiner*—Adolf DSouza
(74) *Attorney, Agent, or Firm*—Jenkins, Wilson, Taylor & Hunt, P.A.

(57) ABSTRACT

Viterbi decoder for decoding a received sequence of data symbols which are coded using a predetermined coding instruction is provided. The Viterbi decoder includes a branch metric calculation circuit for calculation of branch metrics for the received sequence of coded data symbols. The Viterbi decoder includes a path metric calculation circuit for calculation of path metrics as a function of the branch metrics and the coding instruction, with the calculated path metrics in each case being compared with an adjustable decision threshold value in order to produce an associated logic validity value. The Viterbi decoder also includes a selection circuit which temporarily stores those path metrics whose validity value is logic high in a memory, and selects from the temporarily stored path metrics that path with the optimum path metric.

15 Claims, 13 Drawing Sheets

FOREIGN PATENT DOCUMENTS

JP        2000 059 238        2/2000

OTHER PUBLICATIONS

Shieh, Ming-Der et al., "Efficient Management of In-Place Path Metric Update And Its Implementation for Viterbi Decoders," *IEEE International Symposium on Circuits and Systems*, vol. 4, pp. 449-452 (May 31, 1998).

Shung, C. Bernard et al., "VLSI Architectures for Metric Normalization in the Viterbi Algorithm," *IEEE International Conference on Communications*, vol. 4, pp. 1723-1728 (Apr. 15, 1990).

Tsui, Chi-ying et al., "Low Power ACS Unit Design for the Viterbi Decoder," *IEEE International Symposium on Circuits and Systems*, pp. 137-140 (May 30, 1999).

* cited by examiner

| SW$_{norm}$ | N$_{TS}$/SNR BER≈1E-7 | R | R$_{PTDS}$ (N$_{PE}$) | | | |
|---|---|---|---|---|---|---|
| | | | 1 | 2 | 4 | 8 |
| 1.000 | 512/22.5dB | 99.6 | 97.4 | 95.4 | 88.7 | 76.6 |
| | 256/22.8dB | 99.2 | 96.1 | 91.0 | 80.2 | 59.2 |
| | 128/23.0dB | 98.4 | 91.0 | 80.9 | 61.3 | 39.8 |
| | 64/23.6dB | 96.9 | 80.8 | 62.7 | 39.7 | 18.3 |
| 1.125 | 512/22.5dB | 99.6 | 93.3 | 88.3 | 73.2 | 52.2 |
| | 256/22.8dB | 99.2 | 89.5 | 75.8 | 54.8 | 26.0 |
| | 128/23.0dB | 98.4 | 77.4 | 55.9 | 26.5 | 7.7 |
| | 64/23.6dB | 96.9 | 58.3 | 32.2 | 12.7 | 3.2 |
| 1.250 | 512/22.5dB | 99.6 | 84.2 | 71.1 | 45.2 | 23.3 |
| | 256/22.8dB | 99.2 | 74.9 | 49.3 | 24.2 | 4.9 |
| | 128/23.0dB | 98.4 | 51.4 | 24.9 | 4.3 | 0.1 |
| | 64/23.6dB | 96.9 | 31.6 | 9.5 | 1.6 | 0.0 |

Fig. 14

VITERBI DECODER

RELATED APPLICATIONS

This application is a continuation of PCT patent application Ser. No. PCT/EP02/00595, filed Jan. 22, 2002, which claims priority to German patent application number 10102928.4, filed Jan. 23, 2001, the disclosures of each of which are incorporated herein by reference in their entirety.

TECHNICAL FIELD

The invention relates to a Viterbi decoder having a low power consumption for decoding a received sequence of data symbols.

BACKGROUND ART

A Viterbi decoder is known from Tsui Chi-Ying, et al. "Low Power ACS Unit Design for the Viterbi Decoder" in IEEE Proceedings of the 1998 International Symposium on Circuits and Systems, ISCAS 1999, pages 137-140 Volume 1, which contains a branch metric calculation circuit for calculation of branch metrics, a path metric calculation circuit for calculation of path metrics as a function of the branch metrics, and a selection circuit, in order that the path which has the optimum path metric is selected from the temporarily stored path metrics.

JP 2000059238 describes a code synchronization decision circuit for a Viterbi decoder, in which the selection is carried out using an adjustable threshold value.

DE 197 42 958 A1 describes a coprocessor for provision of auxiliary functions for a Viterbi decoding method.

A Viterbi decoder is likewise known from Shieh Ming-Der et al "Efficient Management of In-Place Path Metric Update and its Implementation for Viterbi Decoders IN" IEEE Proceedings of the 1998 International Symposium on Circuits and Systems, ISCAS 1998, pages 449-452 Volume 4, which has a branch metric calculation circuit, a path metric calculation circuit and a selection circuit.

Shung, C. B. "VLSI architectures for metric normalization in the Viterbi algorithm IN" IEEE International Conference on Communications, 1990. ICC 1990, Including Supercomm Technical Sessions. SUPERCOMM/ICC 1990. Conference Record., 1990, pages 1723-1728 Volume 4 describes techniques for normalization of the path metrics.

Viterbi decoders are used for decoding what are referred to as convolution codes. During this decoding process, the received data sequence is compared continuously with theoretically possible transmission data sequences, and the level of the match is used as the basis for a decision, by means of a statistical calculation method. Viterbi decoders are used in most conventional digital mobile radio receivers. A Viterbi decoder is what is referred to as a maximum likelihood decoder, which is generally used for decoding channel-coded, in particular convolutional-coded, mobile radio or cable-based telecommunications signals.

FIG. 1 shows a transmitter and a receiver, which contains a Viterbi decoder according to the prior art. Within the transmitter, a signal source produces data symbols, which are supplied to a convolutional coder. The convolutional-coded transmission data symbols are modulated in a modulator and are supplied via any given transmission channel to the receiver. Only the received signal is demodulated in a demodulator in the receiver, and is then equalized. The received data symbols are decoded in a Viterbi decoder which is contained in the receiver, and are emitted to a data sink for further data processing.

During the channel coding process, redundant information is added in the transmitter to the data symbols to be transmitted, in order to improve the transmission reliability. During the transmission process via a telecommunications channel, the transmitted signal has noise superimposed on it. The receiver uses the received data symbol sequence to extract from all the possible data transmission signals that data transmission sequence which has the highest probability of corresponding to the actually transmitted sequence.

The coding rule which is used for coding can be described by a corresponding trellis diagram. The Viterbi decoder contained in the receiver calculates what are referred to as metrics in order to determine that path in the trellis diagram which has the highest or the lowest path metric depending on the configuration of the Viterbi decoder. The Viterbi decoder uses this selected optimum path to determine the decoded data sequence, and to pass it to the data sink.

The metrics are preferably calculated on the basis of a telecommunications channel which is governed by additive white noise with a Gaussian distribution.

By way of example, FIG. 2 shows a trellis diagram with in each case four different states at the various times to t+3. The states correspond, for example, to the bit states 00, 10, 01, 11. Each data symbol sequence in the trellis diagram illustrated in the figure has a corresponding associated path. A path in this case comprises a sequence of branches between two successive states. In this case, each branch symbolizes a state transition between two successive states, in which case, for a code configured as shown in FIG. 2, the upper branch which originates from one state generally corresponds to a received data symbol with the binary value 0, and the lower branch which originates from the same state corresponds to a received symbol with the binary value one. Each of these state transitions, to which a branch metric $\lambda_t$ is assigned, corresponds to a code symbol.

The branch metric $\lambda_t$ is defined for Gaussian, white noise as follows:

$$\lambda_t = |Y_t - R_t|^2 \tag{1}$$

where $R_t$ is a received symbol at the time t, and $Y_t$ is a transmission signal expected as a function of this at the time t.

Furthermore, each path is assigned a path metric $\gamma_t$ by the trellis diagram at the time t. This is defined as the sum of the branch metrics for a path $$\gamma_t = \sum_{-\infty}^{t} \lambda_i = \sum_{-\infty}^{t} |Y_t - R_t|^2 \tag{2}$$

This calculation rule obviously contains the following recursion:

$$\gamma_t = \gamma_{t-1} + \lambda_t \tag{3}$$

The Viterbi decoder contained in the receiver and illustrated in FIG. 1 uses the trellis diagram to determine that path which has the best path metric. By definition, this is generally the path with the lowest path metric. In the illustrated embodiment of a Viterbi decoder, this corresponds to the summed Euclidean distance. This path is that path which has the highest probability of having been transmitted.

The path metric of a path $\lambda_t^s$ which leads to a specific state s is composed of the path metric $\gamma_{t-1}^{s'}$ of a previous state and the branch metric $\lambda_t^{s' \to s}$ of the branch which leads from this previous state s' to the specific state s. There is therefore no need for all possible paths and path metrics in the trellis diagram to be determined and evaluated by the Viterbi decoder. In fact, that path which has the best path metric prior to this time and prior to this state is determined for each state and for each time step in the trellis diagram. This is the only path which is temporarily stored, and the calculation process continues with the path metric of the partial winner path which opens into this state. All other paths which lead to this state are ignored. During each time step, there are thus a number of such paths corresponding to the number of different states $N_{TS}$. The recursive calculation rule for the path metrics is in the form of a path metric calculation circuit, or an add/compare select unit (ASCU), within the Viterbi decoder.

FIG. 3 shows a Viterbi decoder according to the prior art. The Viterbi decoder as is illustrated in FIG. 3 contains a branch metric calculation circuit (BMU: Branch Metric Unit), a path metric calculation circuit (ASCU: Add-Compare-Select-Unit) and a selection circuit (SMU: Survivor Memory Unit). The branch metric calculation circuit BMU calculates the branch metrics $\lambda_t(s)$, which are a measure of the difference between a received data symbol and that data symbol which causes the corresponding state transition in the trellis diagram. The branch metrics calculated by the branch metric calculation circuit BMU are supplied to the path metric calculation circuit ASCU in order to calculate the optimum paths and winner paths. The downstream selection circuit SMU stores the winner paths in a memory. Decoding is then carried out on the basis of that winner path which has the best path metric. The data symbol sequence associated with this path has the greatest probability of corresponding to the actually transmitted data sequence.

FIG. 4 shows the path metric calculation circuit ASCU contained in the conventional Viterbi decoder in detail. The path metric calculation circuit receives the calculated branch metrics from the branch metric calculation circuit BMU, and evaluates them. The evaluation is in this case carried out by means of various path metric calculation elements or processor elements PE. Depending on the version of the code, the ASCU processor element makes a decision between two or more competing paths which open into one state in the trellis diagram. The path with the better calculated metric is selected, and the path metric of the winner path which leads to this state is renewed.

FIG. 5 shows an ASCU processor element or path metric calculation element according to the prior art. The processor element contains two adders, whose outputs are connected to a multiplexer and to a comparator circuit. The first adder calculates the path metric of a first path, and the second adder calculates the path metric of a second path in the trellis diagram. The two path metrics are supplied to a comparator, where they are compared. The comparator emits a control signal to the multiplexer, and passes on the winner path, that is to say by definition the path with the lower path metric. The calculated path metric is temporarily stored by an associated downstream memory element, for example a register R, for the next calculation step.

The trellis diagram illustrated in FIG. 2 is a trellis diagram with what is referred to as a butterfly structure. This means that two states of a time step t+1 in the trellis diagram are in each case associated with two states from the previous time step t whose branches in each case lead to the first-mentioned states for the time step t+1. In this case, two branch metrics of the branches which originate from different states are in each case identical. In general, $\gamma_t(s)$ denotes the path metric which is associated with the state s in the time step t, while $\lambda_t(s)$ denotes the branch metric of the state transition, which corresponds to the signal s, at the time t. In the Viterbi decoder according to the prior art, two path metric calculation elements of the ACSU are combined in order to form a butterfly path metric calculation element. The advantage is that the path metrics for each state relating to the time index t−1 need be read only once with preferably sequential implementation of the ACSU. Process or elements configured in this way behave in the same way as conventional Add-Compare-Select processor elements, with the only difference being that they calculate two states of the trellis diagram at the same time.

Since the path metric calculation rule, by virtue of the recursion, represents a sum of the time index t'=−∞ . . . t (see equation 2), overflowing of the path metrics must be prevented by what is referred to as a normalization circuit. The minimum normalization method is preferably used for this refinement of the Viterbi decoder. In this case, the minimum path metric for the time index t−1 is determined and is subtracted equally from all the winner path metrics for the time index t. With this method, precisely the noise component of the received signal $R_t$ is subtracted, statistically on average.

The comparison results $\delta_s$ calculated by the various processor elements PE are emitted to the downstream selection circuit SMU for selection of the correct winner path.

The disadvantage of the Viterbi decoder illustrated in FIG. 4 and according to the prior art is that all the decision values $\delta_s$ for selection of the winner path must be stored together with the optimum path metric in the memory of the selection circuit SMU. The number of decisions $\delta_s$ which must be stored in this case corresponds to the number $N_{TS}$ of states in the trellis code. Thus, with the Viterbi decoder illustrated in FIG. 4 and according to the prior art, $N_{TS}$ decisions are stored in the selection circuit SMU for each symbol time step. This storage process is highly redundant, since the decoder requires only the decision for one state per time index t in order in the end to reconstruct the winner path and hence the decoded data symbols.

Depending on the embodiment of the Viterbi decoder, the memory accesses dominate the power loss. The power loss $P_v$ caused by writing all the decision values $\delta_s$ from the path metric calculation circuit to the selection circuit SMU is thus very high. When using a Viterbi decoder, for example, in a mobile radio, the operating life is shortened by discharging the batteries more quickly. Furthermore, for example in multichannel telecommunications systems such as ADSL and SDSL, the high power loss leads to an undesirable amount of heating being produced.

SUMMARY OF THE INVENTION

The object of the present invention is thus to provide a Viterbi decoder and a decoding method which minimize the power loss.

The invention provides a Viterbi decoder for decoding a received sequence of data symbols which are coded using a predetermined coding instruction, having:
- a branch metric calculation circuit (BMU) for calculation of branch metrics for the received sequence of coded data symbols,
- a path metric calculation circuit (ACSU) for calculation of path metrics as a function of the branch metrics and the coding instruction, with the calculated path metrics in each case being compared with an adjustable decision threshold value SW in order to produce an associated logic validity value, and having a selection circuit (SMU) which temporarily stores only those path metrics whose validity value is logic high in a memory, and selects from the path metrics that path with the optimum path metric.

The selection circuit (SMU) preferably emits the data symbol sequence associated with the selected path to a data processing unit for further data processing.

The path metric calculation circuit (ASCU) preferably sets the respective validity value to logic high when the associated calculated path metric is lower than the associated adjustable decision threshold value SW.

The selection circuit (SMU) preferably selects the path with the lowest calculated path metric.

The path metric calculation circuit (ASCU) preferably contains a path metric calculation element ($N_{PE}=1$) and calculates the recursive path metric calculation rule sequentially.

A path metric calculation element in the path metric calculation circuit of the Viterbi decoder according to the invention preferably in each case calculates the path metrics of two paths and compares them with one another, with the path metric calculation element emitting the lower of the two path metrics to an associated downstream memory element for temporary storage.

In one particularly preferred embodiment of the Viterbi decoder according to the invention, the path metric calculation element contains a first adder, which adds the branch metric of a first path and the path metric of the first path which is temporarily stored in the clock register, and emits this to a first input of a multiplexer, a second adder, which adds the branch metric of the second path and the path metric of the second path which is temporarily stored in the clock register, and emits this to a second input of the multiplexer, a first comparator circuit, which compares the sum values calculated by the two adders, with the comparison result value being emitted to the selection circuit and to the multiplexer as a control signal, with the multiplexer passing on the lower of the sum values calculated by the two adders to an associated clock register, a second comparator circuit, which compares the passed-on sum value with the adjustable decision threshold value SW and emits a logic high validity value when the sum value is less than the decision threshold value SW.

A hard-wired decision threshold value SW is preferably a power value to the base two, with the minimum normalization method preferably being used.

This offers the advantage that the number of logic gates required to carry out the comparison, and thus the circuit complexity for comparator circuits, is minimized.

The invention also provides a method for decoding a coded data symbol sequence, which is coded using a predetermined coding instruction, having the following steps, namely, (a) reception of the coded data symbol sequence, (b) calculation of branch metrics for the received data symbol sequence, (c) calculation of path metrics for the received data symbol sequence as a function of the branch metrics and the coding instruction, (d) comparison of the calculated path metrics with an adjustable decision threshold value for production of logic validity values, (e) storage of those calculated path metrics whose validity values are logic high in a temporary store, (f) selection of that path whose stored path metric is a minimum, (g) determination of the data associated with the selected path, by means of the coding instruction, (h) emission of the determined data symbol sequence for further data processing.

BRIEF DESCRIPTION OF THE DRAWINGS

Preferred embodiments of the Viterbi decoder according to the invention and of the decoding method according to the invention will be described in the following text, in order to explain the features that are essential to the invention, with reference to the attached figures, in which:

FIG. 14 shows a table to illustrate the power loss saving with the Viterbi decoder according to the invention;

DETAILED DESCRIPTION OF THE INVENTION

Figure 1:
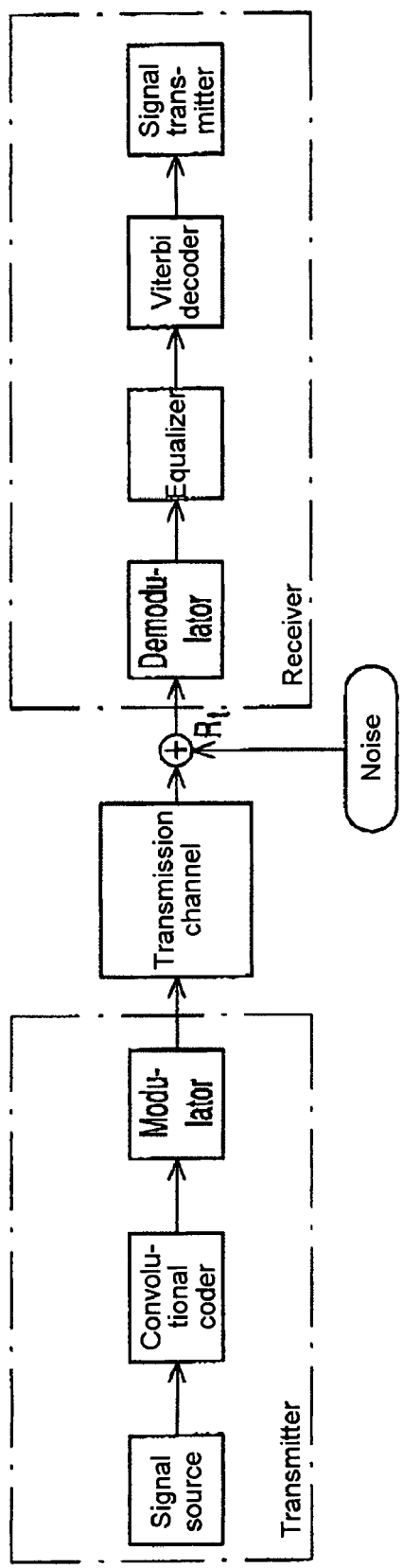
FIG. 1 shows a block diagram of a transmitter and of a receiver, which contains a Viterbi decoder according to the prior art.
Figure 2:
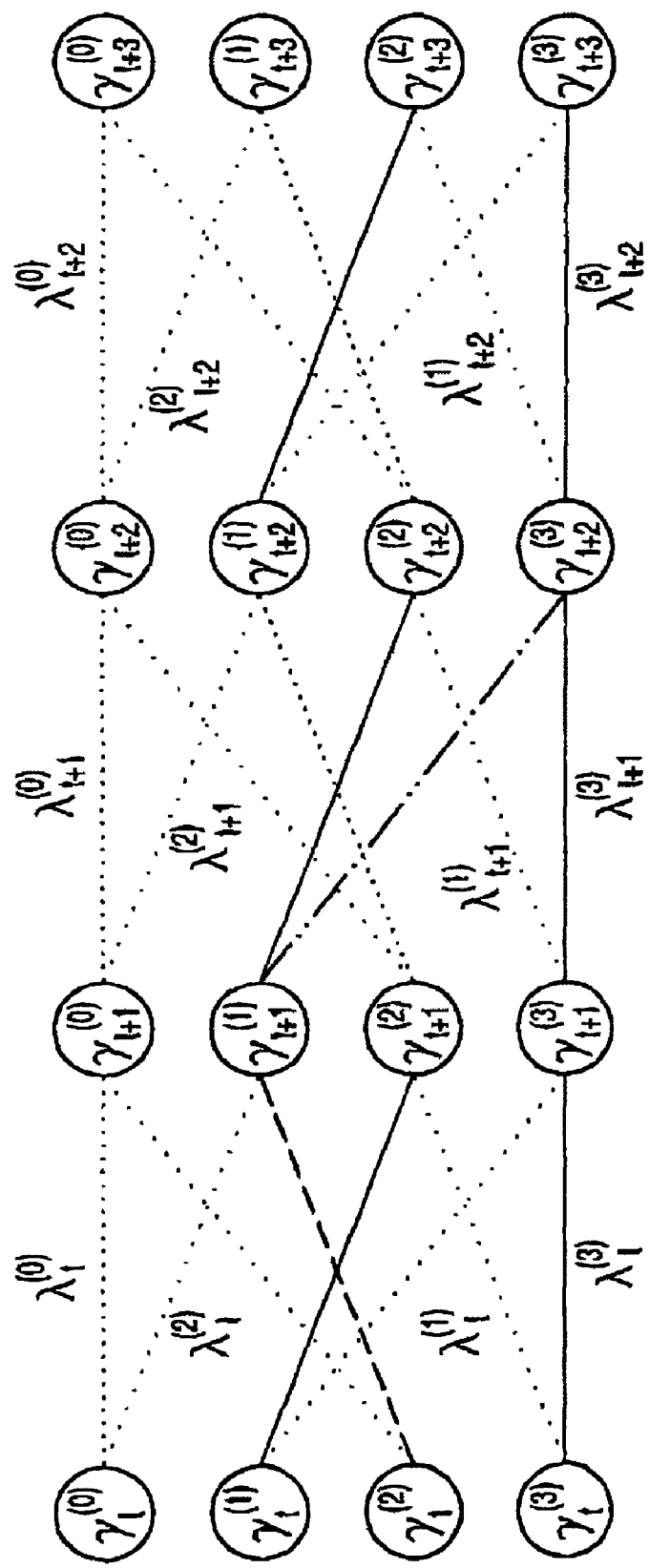
FIG. 2 shows a four-state trellis diagram as a coding instruction.
Figure 3:
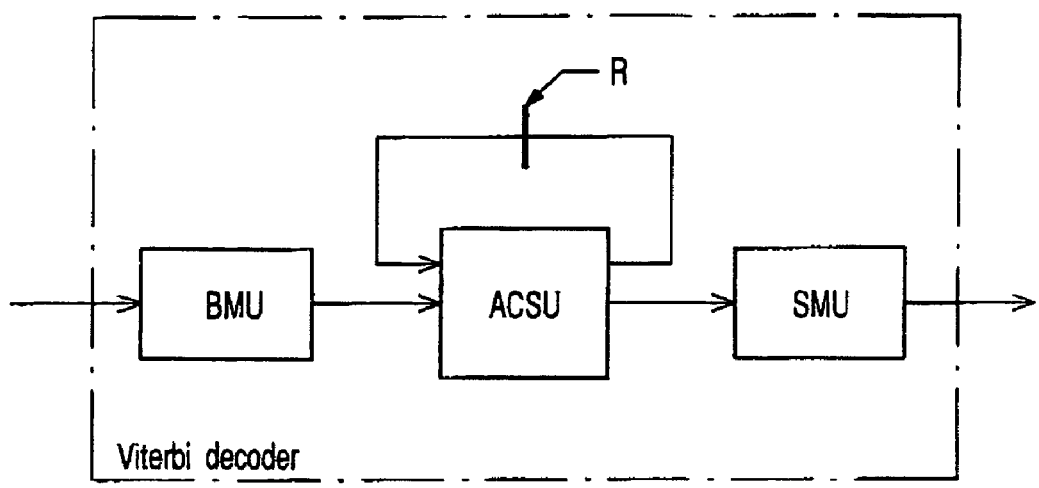
FIG. 3 shows a block diagram of the circuitry configuration of a Viterbi decoder according to the prior art.
Figure 4:
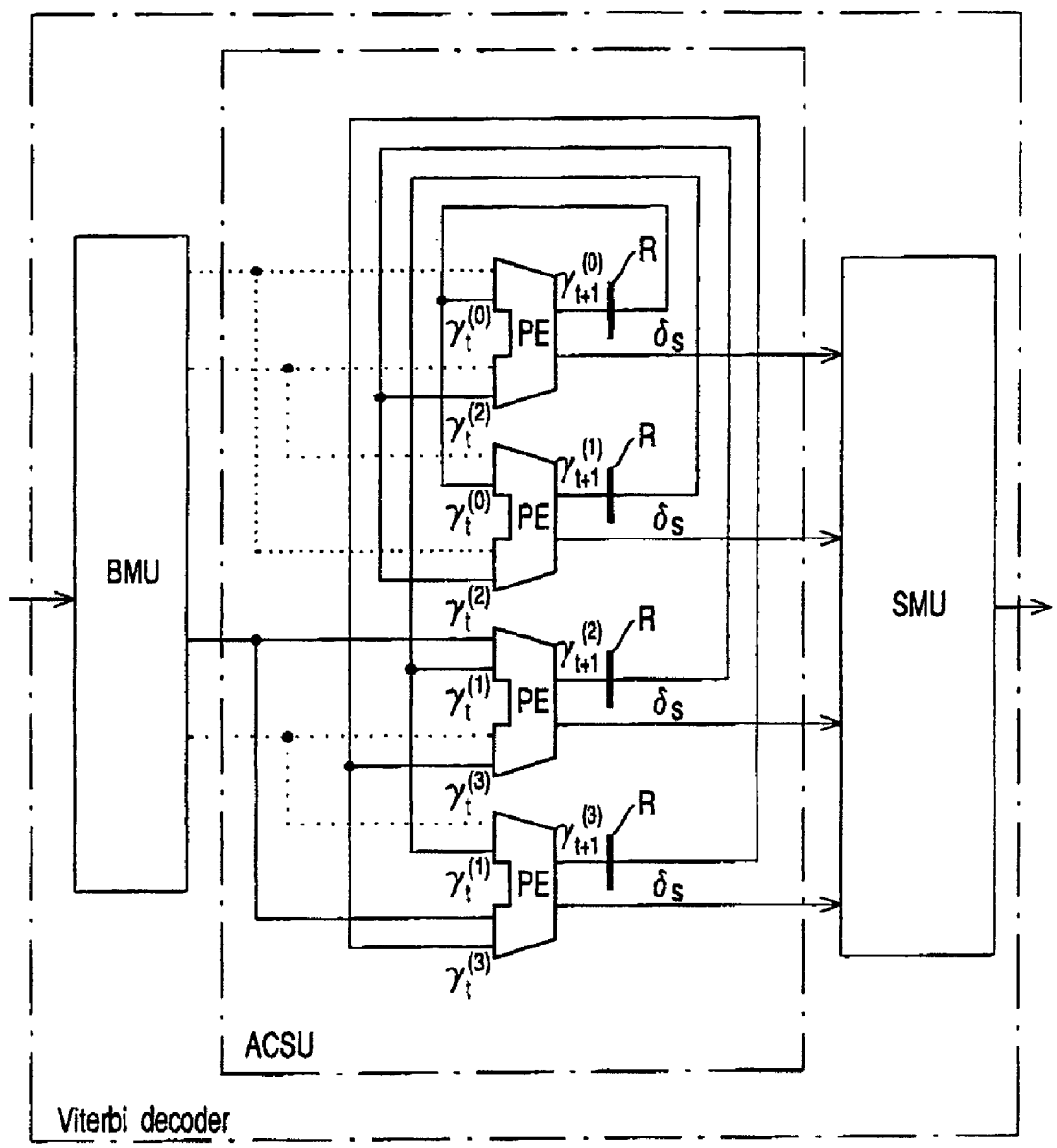
FIG. 4 shows a circuit diagram of a path metric calculation circuit ASCU within a Viterbi decoder according to the prior art, with reference to the coding instruction illustrated in FIG. 2.
Figure 5:
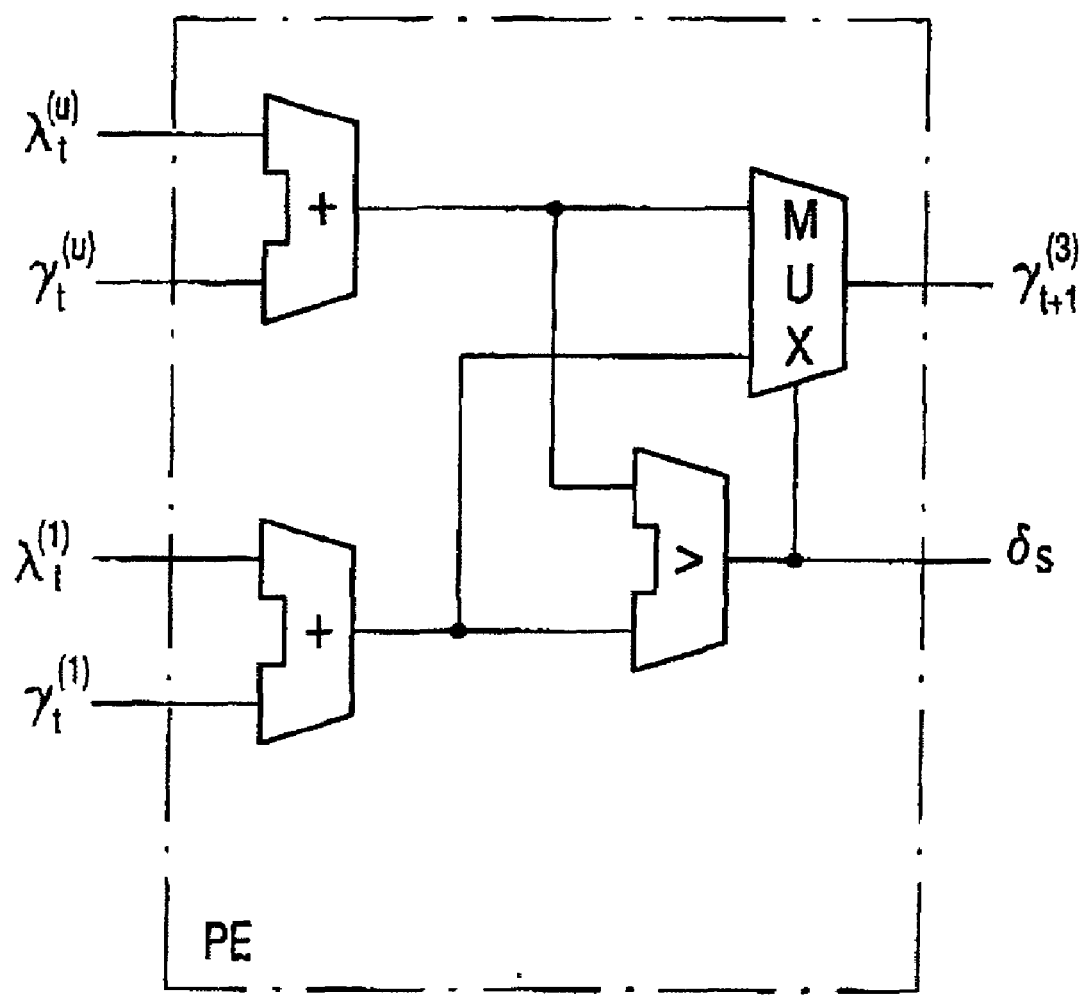
FIG. 5 shows a processor element PE, which is contained in the path metric calculation circuit (ASCU), according to the prior art.
Figure 6:
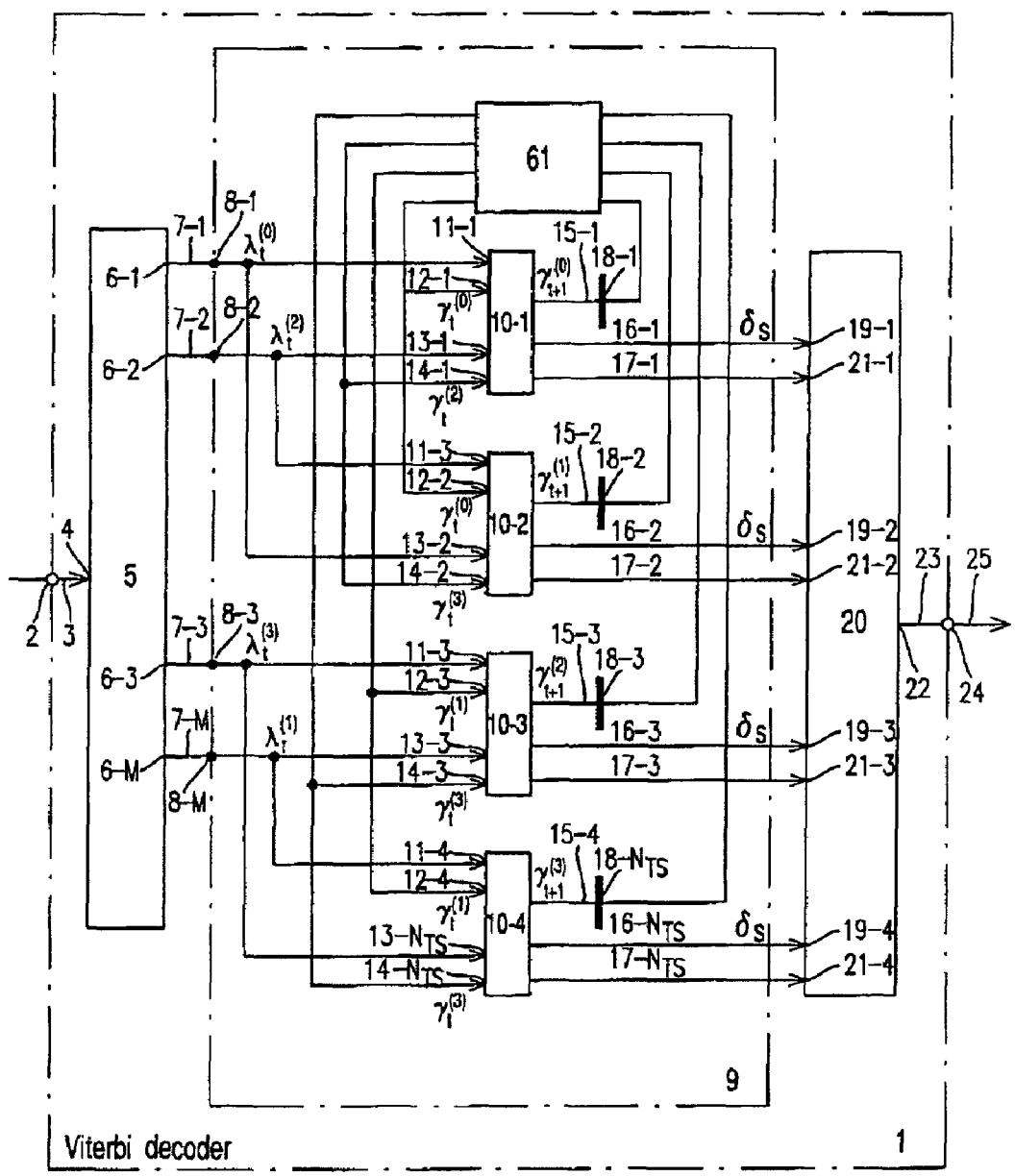
FIG. 6 shows the circuitry configuration of a Viterbi decoder according to the invention, with reference to the coding instruction illustrated in FIG. 2.

FIG. 6 shows a Viterbi decoder 1 according to the invention. The Viterbi decoder 1 has a signal input 2 for receiving the demodulated and equalized sequence of data symbols. The data symbols are passed via a line 3 and a signal input 4 to a branch metric calculation circuit 5. The branch metric calculation circuit 5 calculates branch metrics $\gamma_t$ for a received sequence of coded data symbols as a function of this sequence. The calculated branch metrics are emitted from the signal outputs 6-1 to 6-M via signal lines 7-1 to 7-M and signal inputs 8-1 to 8-M to a path metric calculation circuit 9. M in this case defines the number of different branch metrics and is generally a power to the base two. The path metric calculation circuit 9 calculates the path metrics $\gamma$ as a function of the supplied branch metrics $\lambda$ and the predetermined coding instruction in the form of a trellis diagram. The path metric calculation circuit 9 contains two or more path metric calculation elements 10-1 to 10-$N_{TS}$. The path metric calculation elements are preferably a butterfly processor element or an add compare processor element. Each path metric calculation element 10 has four signal inputs 11, 12, 13, 14 and three signal outputs 15, 16, 17. Each path metric calculation element 10 calculates the path metric $\gamma$ for two competing paths in the trellis diagram, and compares them to one another. Since the result $\delta_t(s)$ which is calculated for a state s in the time step t is at the same time the basis for the calculation of a path metric for a subsequent state, the calculated path metric is temporarily stored in an associated downstream memory element 18, and is fed back to the signal inputs of the path metric calculation elements 10 via a hard-wired unit 61, in accordance with the trellis code. The path metric calculation elements 10 calculate decision values $\delta_s$ which are emitted by means of the output signal lines 16 to signal inputs 19 of a downstream selection circuit 20. The path metric calculation element 10 calculates an associated logic validity value for each decision value $\delta_s$, and this validity value is emitted via the signal lines 17 to an associated signal input 21 of the selection circuit 20.

The selection circuit 20 contains an internal memory. In this case, the only decision values $\delta_s$ applied to the signal inputs 19 that are written to the memory of the selection circuit 20 are those whose associated validity value, which is applied to the corresponding signal input 21, is a logic high. This considerably reduces the number of writing processes to the memory, and hence the power loss, of the selection circuit 20.

The number of stored decision values $\delta$ can at best be reduced by a factor $R_D$, with $N_{TS}$ representing the number of states in the trellis diagram.

$$R_D = \frac{N_{TS} - 1}{N_{TS}} \quad (4)$$

The selection circuit 20 uses the temporarily stored path metrics to select that path in the trellis diagram that has the optimum path metric. In this case, by definition, the selection circuit 20 selects the path with the lowest calculated path metric. The data symbol sequence which is associated with the selected path is emitted from the selection circuit 20 via a signal output 22 and a line 23 to a signal output 24 of the Viterbi decoder 1 according to the invention, and is passed from there via a line 25 to a downstream data processing unit, for further data processing.

Figure 7:
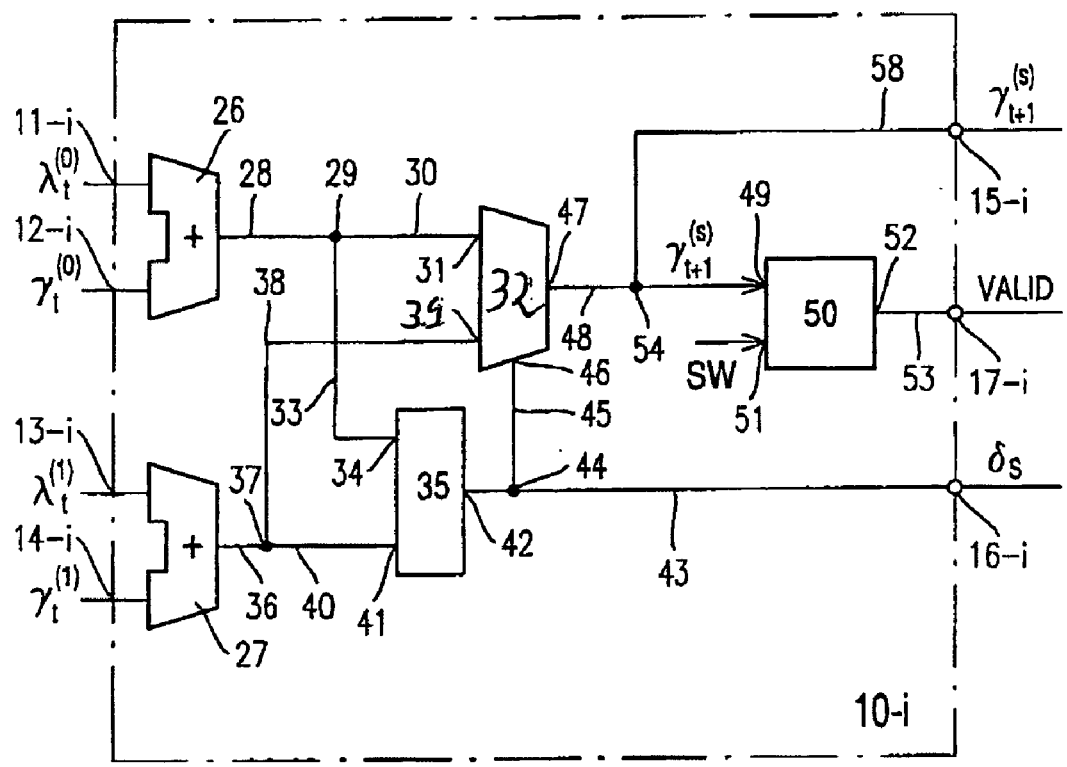
FIG. 7 shows the circuitry configuration of a path metric calculation element within the path metric calculation circuit of the Viterbi decoder according to the invention illustrated in FIG. 6.

FIG. 7 shows the circuitry configuration of a processor element 10-$i$ within the path metric calculation circuit 9 of the Viterbi decoder 1 according to the invention. The path metric calculation element 10-$i$ calculates the path metrics of two competing paths, and compares them to one another. The lower of the two calculated path metrics is emitted via the signal output 15-$i$ to the associated clock register 18-$i$, for temporary storage and for feedback. The path metric calculation element 10-$i$ illustrated in FIG. 7 contains a first adder 26 and a second adder 27. The first adder 26 adds the branch metric $\lambda_t(u)$ for a first lower path and an associated temporarily stored path metric $\gamma_t(u)$ for a first sum value, which is emitted via a line 28 to a branching node 29, which is connected via a line 30 to a first input 31 of a multiplexer 32, and is connected via a line 33 to a signal input 34 of a first comparator circuit 35.

The second adder 27 adds the branch metric $\lambda_t(l)$ for the second lower signal path in the trellis diagram to the associated temporarily stored and fed-back path metric $\gamma_t(l)$ to form a second sum value, which is emitted via a line 36 to a branching node 37. The branching node 37 is connected via a line 38 to a second signal input 39 of the multiplexer 32. The branching node 37 is also connected via a line 40 to a second input 41 of the first comparator circuit 35. The first comparator circuit 35 compares the calculated sum values and/or path metrics which are emitted from the two adders 26, 27 with one another, and emits a comparison result value or decision value $\delta_s$ via a signal output 42 and via a line 43 to the signal output 16.

The comparison result value or decision value $\delta_s$ is also tapped off at a branching node 44, and is applied via a control line 45 to a control input 46 of the multiplexer 32, as a control signal. The multiplexer 32 is driven such that the lower of the two sum values or path metrics which are calculated by the two adders 26, 27 is passed to a signal output 47 of the multiplexer 32. The path metric which has been passed on is emitted via a line 48 from the signal output 47 to a signal input 49 of a second comparator circuit 50. The second comparator circuit 50 has a second input 51, to which a decision threshold value SW, which is adjustable or is implemented such that it is fixed, is applied.

The second comparator circuit 50 compares the sum value which is applied to the input and is passed on with the decision threshold value SW that has been set, and emits a logic high validity value via a signal output 52 and a line 53 when the applied sum value or path metric value is less than the applied decision threshold value SW. This is obtained from the product of a normalized threshold value $SW_{Norm}$ and the maximum possible branch metric $\lambda_{max}$ as follows:

$$SW = SW_{norm} * \lambda_{max} \quad (5)$$

The level of the threshold value SW is set by normalized reference of the bit error rate BER as a function of the normalized threshold value, to the implementation loss-free case, that is to say without any reduction in the memory processes. This can be achieved by setting SW to be equal to infinity.

$$BER_{norm} = \log\left[\frac{BER(SWnorm)}{BER(SWnorm \to \infty)}\right] \quad (6)$$

The normalization of the threshold value is in this case used to make different implementations of the branch metric calculation unit BMU comparable. The normalization of the bit error rate BER is used to compare the losses associated with the method for different signal-to-noise ratios SNR.

For a different number of states $N_{TS}$ in a trellis code, FIGS. 10a-10d show the relationship between the normalized bit error rate $BER_{norm}$ and the normalized threshold value for different signal-to-noise ratios SNR. As can be seen from the diagrams, if the normalized threshold value is unity, the increase in the bit error rate BER is approximately 1%, and is thus negligible. FIGS. 10a-10d also show that the performance loss as a function of the signal-to-noise ratio SNR is constant, that is to say the Viterbi decoder according to the invention for the method according to the invention for decoding matches itself to the signal-to-noise ratio SNR without any additional adaptation rule.

Figure 11:
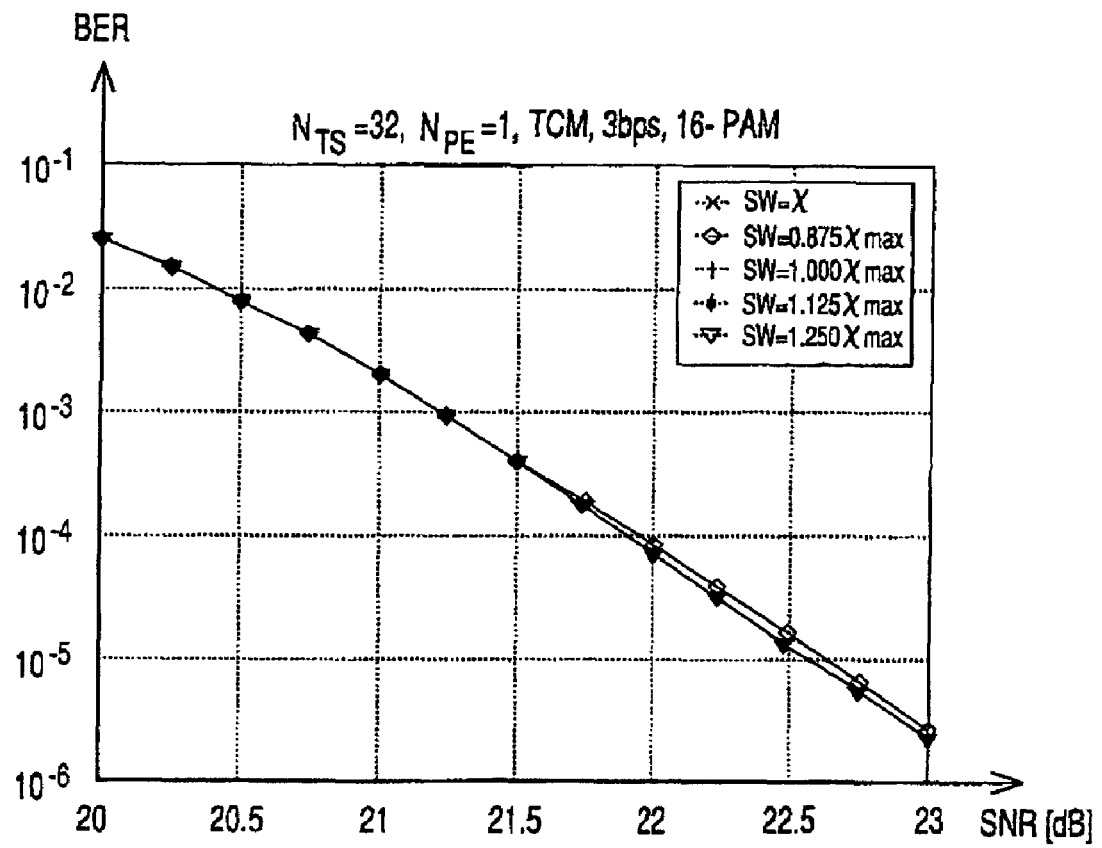
FIG. 11 shows a simulation result which illustrates the dependency of the bit error rate on the signal-to-noise ratio (SNR) as a function of various decision threshold values SW in comparison to Viterbi decoders according to the prior art.

FIG. 11 shows the relationship between the bit error rate BER and the signal-to-noise ratio SNR for the differently set threshold values SW. The threshold value SW=∞ in this case corresponds to a conventional Viterbi decoder according to the prior art. As can be seen from FIG. 11, even $SW_{norm}<1$ leads only to a minor increase in the bit error rate BER. Furthermore, the robustness of the method according to the invention can be seen from the wide variance in the family of parameters.

Figure 12A:
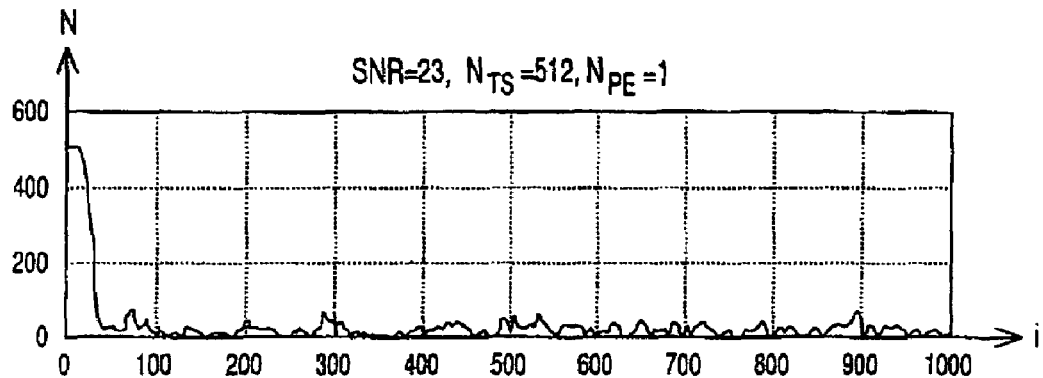
FIGS. 12(a)-12(c) show simulation results which illustrate the number of stored decision values for a large number of data symbol periods for a signal-to-noise ratio which is high in comparison to this preferred embodiment of a Viterbi decoder.
Figure 12B:
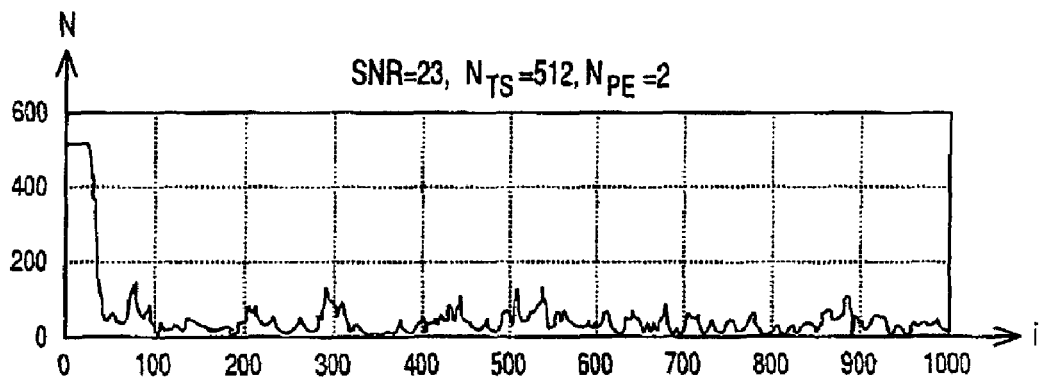
Figure 12C:
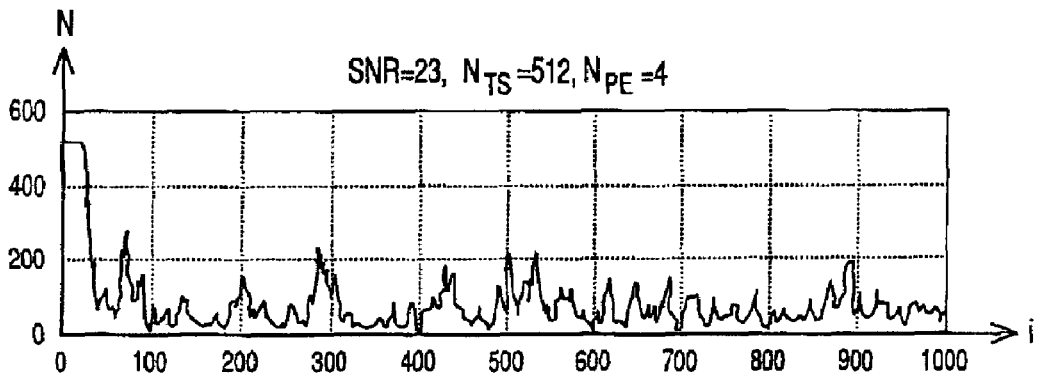

FIGS. 12(a) to 12(c) show a simulation result in order to illustrate the relationship between the number N, the decision values δ stored by the selection circuit 20 for a signal-to-noise ratio SNR=23 dB, and a number of states in the trellis diagram of $N_{TS}$=512, for a different number of processor elements $N_{PE}$. FIGS. 12(a) to 12(c) show the simulation result for the time index t=0 ... 1000. A further advantage of the method according to the invention is that, in comparison to a conventional Viterbi decoder, the self-matching characteristic means that the stabilization process is not moved. It can also be seen that only a small number N of decisions are stored after the stabilization process.

Figure 13A:
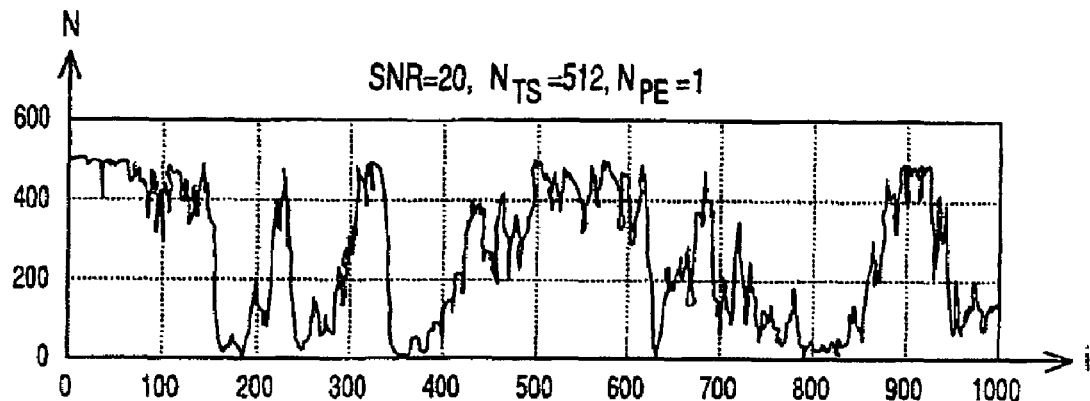
FIGS. 13(a)-13(c) show simulation results which illustrate the number of stored decision values for a large number of data symbol periods for a signal-to-noise ratio which is low in comparison to this preferred embodiment of a Viterbi decoder.
Figure 13B:
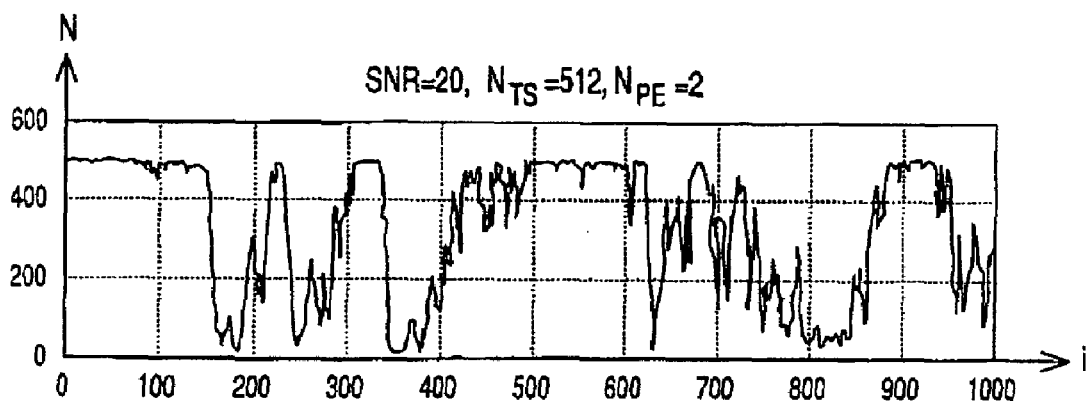
Figure 13C:
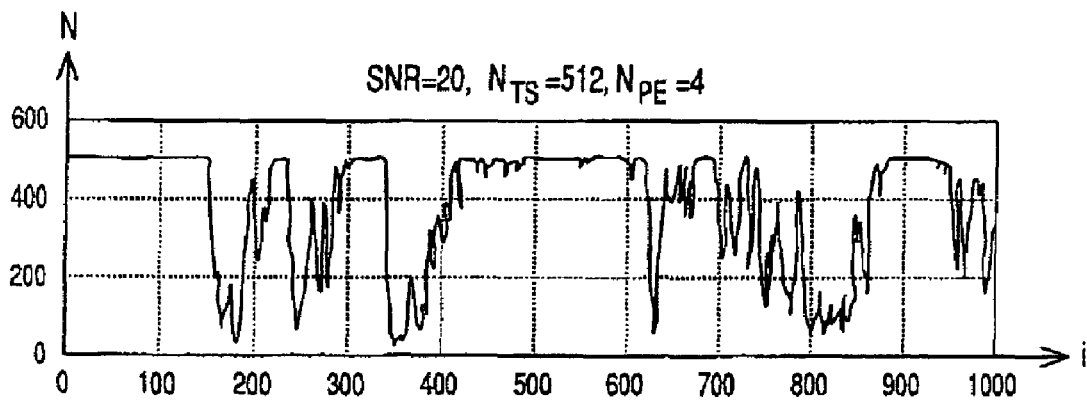

FIGS. 13(a) to 13(c) show a simulation result for the same parameters as in FIGS. 12(a) to 12(c), with the exception of the signal-to-noise ratio, which in this case has been reduced to SNR=20 dB.

With this signal-to-noise ratio, which is poor for this code, and as can be seen by comparing FIGS. 12 and 13, the number of stored decisions for the method according to the invention is considerably higher. As the transmission channel becomes increasingly worse and the signal-to-noise ratio SNR in consequence decreases, the Viterbi decoder according to the invention results in an increasing number of decisions δ being stored for evaluation in the selection circuit 20, in order to achieve a constant decoding quality. The Viterbi decoder 1 according to the invention and the method according to the invention are thus self-matching with respect to the quality of the decoding, which is preferably expressed by the magnitude of the bit error rate BER.

The sum value or path metric value passed on by the multiplexer 32 is also tapped off at a branching node 54, and is emitted via a line 55 at the signal output 15 for temporary storage to the associated register 18.

The decision threshold value SW is preferably a power to the base two, implemented in a fixed manner. This minimizes the circuitry complexity for the second comparator circuit 35. The decision threshold value SW can be adapted as a function of the method for path metric normalization. The method of minimum normalization is preferably used, in which there is no need for this adaptation step. Furthermore, decision threshold values which can be set in a variable manner are feasible in particular in mobile radio systems, since, in these systems, the quality of the transmission channel may vary to a major extent and, for time periods when the transmission characteristics of the telecommunications channel SW are good, can be set so as to achieve a particularly major reduction in the power loss.

The decision value $δ_s$ which is produced at the signal output 16 is written to the downstream memory of the selection circuit 20 only when the associated logic validity value which is produced at the signal output 17 of the path metric calculation element 10 indicates that the sum value which is passed on is below the decision threshold value SW. This considerably reduces the number of writing processes, and hence the power loss, in comparison to a conventional Viterbi decoder, in which all the decision values δ are written to the downstream detection circuit.

The table shown in FIG. 14 shows the percentage power loss saving for the decoding method according to the invention, for various normalized threshold values as a function of the number of path metric calculation elements $N_{PE}$, for trellis codes of different complexity. R in this case denotes the maximum possible optimum, and is calculated from:

$$R = \frac{N_{TS} - 2N_{PE}}{N_{TS}}. \tag{7}$$

Figure 8:
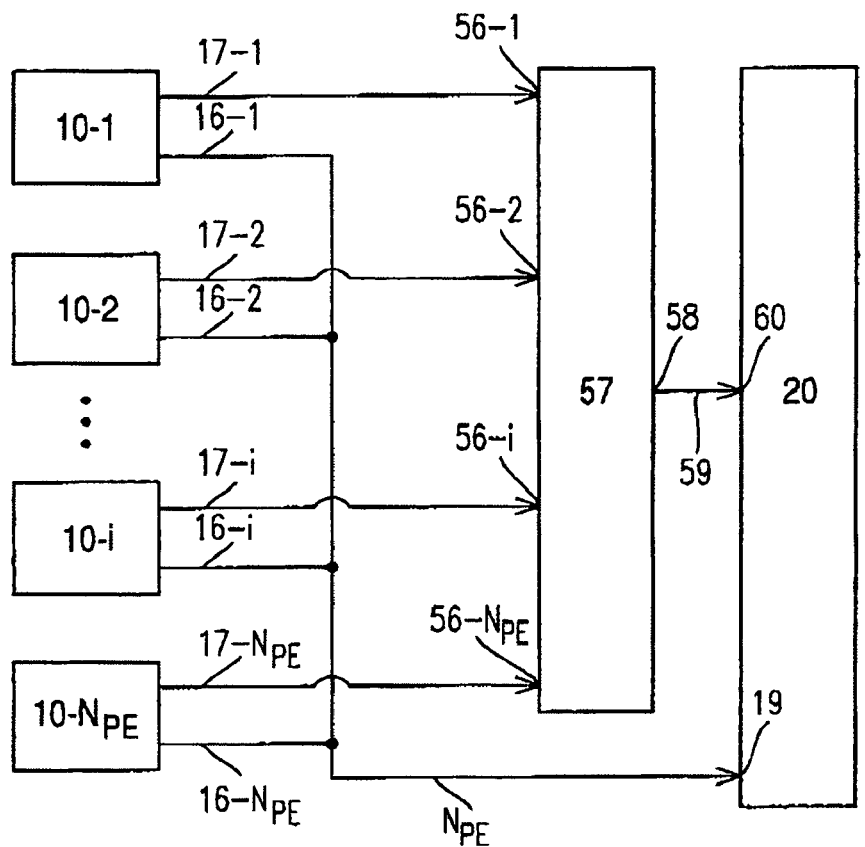
FIG. 8 shows the circuitry configuration of one preferred embodiment of the ACSU and SMU of the Viterbi decoder according to the invention.

FIG. 8 shows, schematically, a further embodiment of the Viterbi decoder 1 according to the invention, with more than one path metric calculation element $N_{PE}>1<N_{TS}$. With the arrangement illustrated in FIG. 8, the logic validity values which are calculated by the path metric calculation elements 10 are applied via the lines 17 to the signal inputs 56 of a logic OR circuit 57, where they are logically OR-linked. The logic OR circuit 57 has a signal output 58, which is connected via a line 59 to one input 60 of the downstream selection circuit 20. As soon as one of the validity values which is calculated by the path metric calculation elements 10 is a logic high or logic one, the selection circuit 20 receives a logic high signal at the signal input 60 and stores the total decision vector, which comprises $N_{PE}$ decision values, in the integrated memory. As soon as at least one significant decision value is available, a writing process thus takes place, in order to guarantee that no significant decision value, that is to say a decision value that is assessed to be logic high, is lost.

Figure 9:
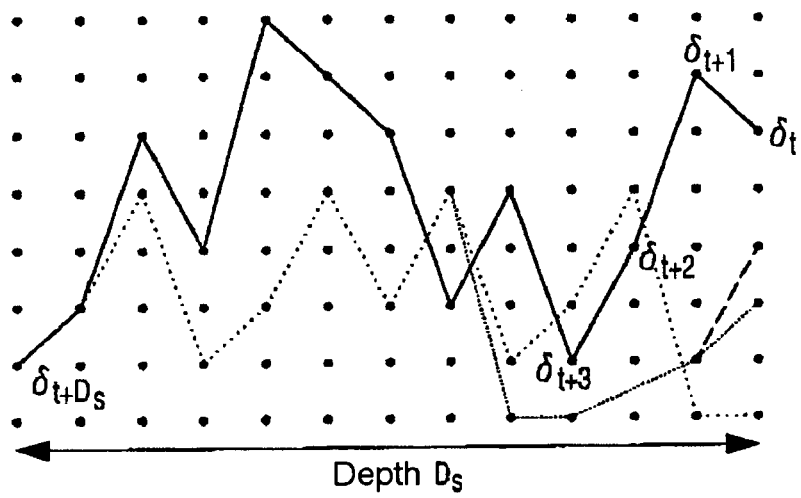
FIG. 9 shows a diagram to explain the selection process within the selection circuit in the Viterbi decoder according to the invention.
Figure 10A:
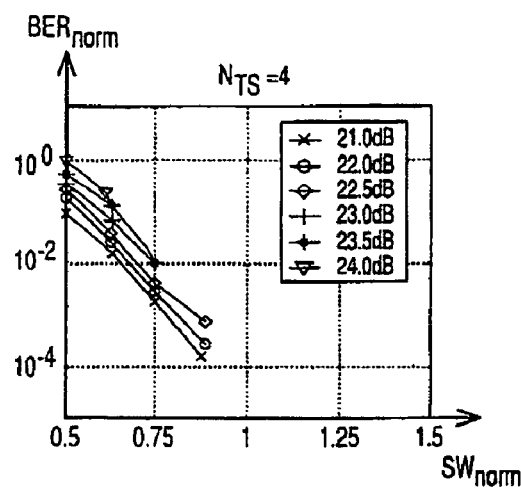
FIGS. 10(a)-(d) show simulation results which illustrate the relationship between the bit error rate and the normalized threshold value.
Figure 10B:
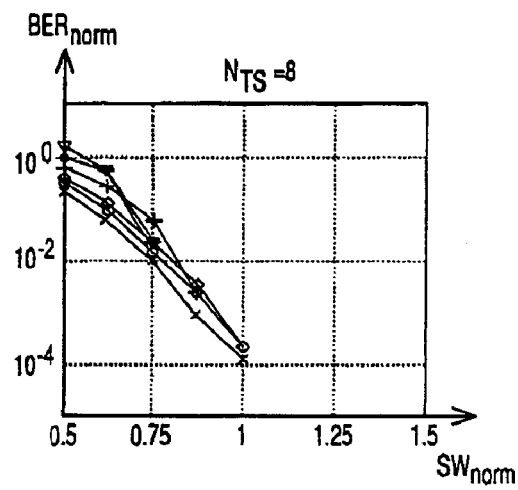
Figure 10C:
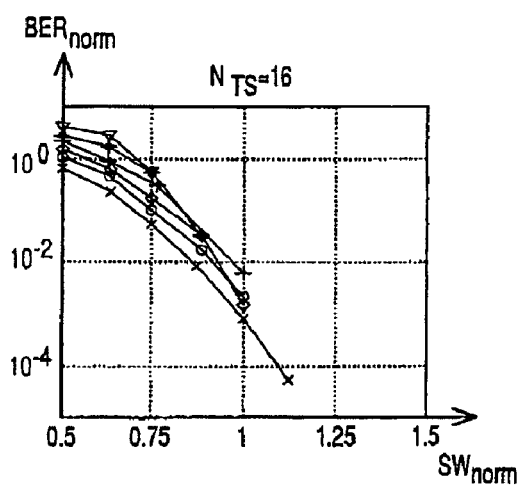
Figure 10D:
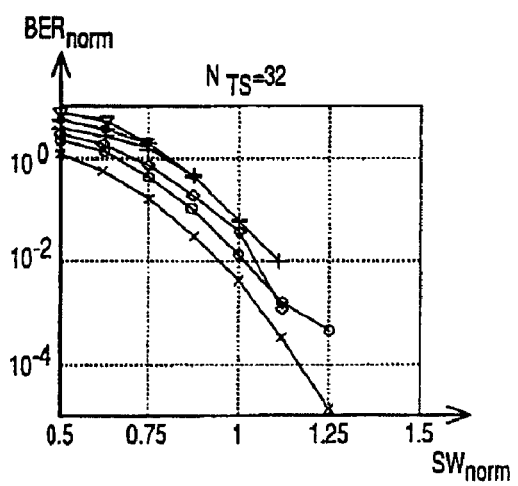

FIG. 9 shows, schematically, the selection process within the selection circuit 20 of the Viterbi decoder 1 according to the invention. Starting from the state with the minimum path metric, the path is followed back to a decision depth $D_s$. After $D_s$ time steps, the decision $δ_{t+D_s}$ is decoded. The solid line in FIG. 9 represents the winner path, while the dashed lines show competing paths. The latency time is $D_s$ symbol times, before a decision is made by the selection circuit 20, and the corresponding data symbol sequence is emitted.

The method according to the invention means that there is a high probability of the selection circuit 20 reading only those decision values which were previously assessed as being relevant from the path metric calculation circuit 9. There is a very low probability of the selection circuit 20 reading from memory cells which contain decision values which were previously assessed as not being relevant and were thus not stored. In rare cases, this can lead to bit errors, which lead to the described, negligible SNR loss.

The circuit according to the invention allows a power loss reduction of up to 99% to be achieved. The additional circuitry complexity in the path metric calculation elements 10 in this case comprises only one additional comparator circuit, which requires only a very small area for integration.

List of Reference Symbols:

| | |
|---|---|
| 1 | Viterbi decoder |
| 2 | Input |
| 3 | Line |
| 4 | Signal input |
| 5 | Branch metric calculation circuit |
| 6 | Signal outputs |
| 7 | Line |
| 8 | Signal inputs |
| 9 | Path metric calculation circuit |
| 10 | Path metric calculation elements |
| 11 | Inputs |
| 12 | Inputs |
| 13 | Inputs |
| 14 | Inputs |
| 15 | Output lines |
| 16 | Output lines |
| 17 | Output lines |
| 18 | Temporary register |
| 19 | Signal inputs |
| 20 | Selection circuit |
| 21 | Signal inputs |
| 22 | Signal output |
| 23 | Line |
| 24 | Output of the Viterbi decoder |
| 25 | Line |
| 26 | Adder |
| 27 | Adder |
| 28 | Line |
| 29 | Branching point |
| 30 | Line |
| 31 | Input |
| 32 | Multiplexer |
| 33 | Line |
| 34 | Input |
| 35 | Multiplexer |
| 36 | Line |
| 37 | Branching node |
| 38 | Line |
| 39 | Input |
| 40 | Line |
| 41 | Input |
| 42 | Output |
| 43 | Line |
| 44 | Branching node |
| 45 | Line |
| 46 | Control input |
| 47 | Output |
| 48 | Line |
| 49 | Input |
| 50 | Comparator circuit |
| 51 | Input |
| 52 | Output |
| 53 | Output |
| 54 | Branching node |
| 55 | Line |
| 56 | Inputs |
| 57 | OR gate |
| 58 | Output |
| 59 | Line |
| 60 | input |
| 61 | Hard wiring unit |

The invention claimed is:

1. Viterbi decoder for decoding a received sequence of data symbols which are coded using a predetermined coding instruction, and are transmitted via a transmission channel, having:
(a) a branch metric calculation circuit for calculation of branch metrics for the received sequence of coded data symbols;
(b) a path metric calculation circuit for calculation of path metrics and decision values as a function of the branch metrics and the coding instruction, with the calculated path metrics in each case being compared with an adjustable decision threshold value in order to produce an associated logic validity value, in which case the decision threshold value for the path metric normalization can be set such that it is variable;
(c) a selection circuit which temporarily stores only those path metrics whose validity value is logic high in a memory, and selects from the temporarily stored path metrics that path with the optimum path metric, with an increasing number of decision values being stored in the selection circuit as the signal-to-noise ratio of the transmission channel decreases;
(d) wherein two or more logic validity values which are produced by the path metric calculation circuit are logically OR-linked by a logic circuit, and all the associated decision values are temporarily stored in the memory of the selection circuit when the result of the logical OR linking is logic high.

2. Viterbi decoder according to claim 1, wherein the selection circuit emits the data symbol sequence which is associated with the selected path for further data processing.

3. Viterbi decoder according to claim 1, wherein the path metric calculation circuit sets the validity value of logic high when the associated calculated path metric is less than the threshold value.

4. Viterbi decoder according to claim 1, wherein the selection circuit selects the path with the lowest calculated path metric.

5. Viterbi decoder according to claim 1, wherein the path metric calculation circuit contains two or more path metric calculation elements.

6. Viterbi decoder according to claim 1, wherein a path metric calculation element in each case calculates the path metrics of two paths and compares them with one another, and emits the lower of the two path metrics to an associated clock memory element for temporary storage.

7. Viterbi decoder according to claim 1, wherein the path metric calculation element has:
(a) a first adder, which adds the branch metric of a first path and the metric of the first path which is temporarily stored in the associated clock memory element, and emits this to a first input of a multiplexer,
(b) a second adder, which adds the branch metric of a second path and the path metric of the second path which is temporarily stored in the associated clock memory element, and emits this to a second input of the multiplexer,
(c) a first comparator circuit, which compares the sum values calculated by the two adders, with the comparison result being emitted as a decision value to the selection circuit and to the multiplexer as a control signal, with the multiplexer passing on the lower of the sum values calculated by the two adders to the associated clock register;
(d) a second comparator circuit, which compares the passed-on sum value with the adjustable decision threshold value and emits a logic high validity value when the passed-on sum value is less than the decision threshold value.

8. Viterbi decoder according to claim 1, wherein the adjustable decision threshold value is a power value to the base two.

9. Viterbi decoder according to claim 1, wherein the path metrics are calculated sequentially by the path metric calculation elements.

10. Viterbi decoder according to claim 1, wherein a number of path metrics, which correspond to the number $N_{TS}$ of states in a Trellis diagram, are calculated using $2^K$ path metric calculation elements, and in that the number $2^K$ of calculation element is given by:

$$1 \leq 2^K \leq \frac{N_{TS}}{2}.$$

11. Viterbi decoder according to claim 10, wherein the path metric calculation elements are butterfly calculation elements, and in that the number $2^K$ of calculation element is given by:

$$1 \leq 2^K \leq \frac{N_{TS}}{2}.$$

12. Viterbi decoder according to claim 11, wherein the path metric calculation elements are add-compare calculation elements, and in that the number $2^K$ of calculation element is given by:

$$1 \leq 2^K \leq N_{TS}.$$

13. Viterbi decoder according to claim 1, wherein the coding instruction is a Trellis code, which has $2^L$ state transitions, where $$0 \leq L < \infty$$

and L is a natural number.

14. Viterbi decoder according to claim 10, wherein the Trellis code has two state transitions.

15. Method for decoding a coded sequence of data symbols which are coded using a predetermined coding instruction, having the following steps:
(a) reception of the coded data symbol sequence via a transmission channel;
(b) calculation of branch metrics for the received data symbol sequence;
(c) calculation of path metrics and decision values for the received data symbol sequence as a function of the branch metrics and the coding instruction;
(d) comparison of the calculated path metrics with a decision threshold value for production of logic validity values, in which case the decision threshold value for path metric normalization can be set such that it is variable;
(e) storage of those calculated path metrics whose validity values are logic high in a temporary store, with an increasing number of decision values being stored as the signal-to-noise ratio of the transmission channel decreases, wherein two or more produced logic validity values are logically OR-linked and all the associated decision values are temporarily stored in the temporary store when the result of the logical OR linking is high;
(f) selection of that path whose stored path metric is a minimum;
(g) determination of the data symbol sequence associated with the selective path, by means of the coding instruction;
(h) emission of the determined data symbol sequence for further data processing.

* * * * *